United States Patent
Low et al.

(10) Patent No.: US 9,093,215 B2
(45) Date of Patent: Jul. 28, 2015

(54) PUSH-PULL DRIVER FOR GENERATING A SIGNAL FOR WIRELESS POWER TRANSFER

(71) Applicant: QUALCOMM Incorporated, San Diego, CA (US)

(72) Inventors: Zhen Ning Low, San Diego, CA (US); Scott C Hooten, San Diego, CA (US); Ngo Van Nguyen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 405 days.

(21) Appl. No.: 13/678,440

(22) Filed: Nov. 15, 2012

(65) Prior Publication Data

US 2013/0293189 A1    Nov. 7, 2013

Related U.S. Application Data

(60) Provisional application No. 61/643,693, filed on May 7, 2012.

(51) Int. Cl.
*H02J 7/00* (2006.01)
*H01F 38/14* (2006.01)
(Continued)

(52) U.S. Cl.
CPC ............... *H01F 38/14* (2013.01); *H02J 5/005* (2013.01); *H02J 7/0052* (2013.01); *H02J 7/025* (2013.01); *H02J 17/00* (2013.01); *H04B 5/0037* (2013.01)

(58) Field of Classification Search
CPC ........ H02J 7/025; H01F 38/14; Y02T 90/122; B60L 11/182; Y02E 60/12
USPC ........................................................ 320/108
See application file for complete search history.

(56) References Cited

U.S. PATENT DOCUMENTS 3,938,024 A    2/1976    Clarke
4,275,343 A  * 6/1981    Fulton et al. .................. 318/721
(Continued)

FOREIGN PATENT DOCUMENTS

EP          0903830 A2      3/1999
WO    WO-2010025720 A2    3/2010
(Continued)

OTHER PUBLICATIONS

Murata Manufacturing Co., Ltd., Basics of Noise Countermeasures [Lesson 6] Common mode choke coils, See Figure 3., 2011. Retrieved from http://www.murata.com/products/emicon_fun/2011/10/emc_en28.html on Apr. 26, 2012.
(Continued)

*Primary Examiner* — Arun Williams
(74) *Attorney, Agent, or Firm* — Knobbe, Martens, Olson & Bear, LLP

(57) ABSTRACT

This disclosure provides systems, methods, and apparatus for transferring power wirelessly via a wireless power transmitter. In one aspect, the transmitter comprises a first circuit configured to generate a first signal, where the first circuit includes a first inductor. The transmitter further comprises a second circuit configured to generate a second signal out of phase with the first signal. The second circuit includes a second inductor inductively coupled with the first inductor. The first inductor and the second inductor may have a leakage inductance of at least a minimum value so as to not produce a substantially square waveform at an output of the first circuit and an output of the second circuit. The transmitter further comprises a filter circuit configured to filter the first signal and the second signal.

36 Claims, 12 Drawing Sheets

(51) Int. Cl.
*H02J 7/02* (2006.01)
*H04B 5/00* (2006.01)
*H02J 5/00* (2006.01)
*H02J 17/00* (2006.01)

(56) References Cited

U.S. PATENT DOCUMENTS

| | | | | |
|---|---|---|---|---|
| 4,538,136 | A | * | 8/1985 | Drabing ........................ 375/306 |
| 4,654,573 | A | * | 3/1987 | Rough et al. .................. 320/108 |
| 4,947,130 | A | * | 8/1990 | Kitayoshi ..................... 324/650 |
| 4,972,292 | A | | 11/1990 | Petersen |
| 6,784,644 | B2 | | 8/2004 | Xu et al. |
| 2001/0054942 | A1 | * | 12/2001 | Takamine et al. .............. 333/195 |
| 2006/0071632 | A1 | * | 4/2006 | Ghabra et al. ................. 320/108 |
| 2007/0182367 | A1 | * | 8/2007 | Partovi ........................... 320/108 |
| 2007/0253575 | A1 | * | 11/2007 | Melanson ....................... 381/97 |
| 2010/0207572 | A1 | | 8/2010 | Kirby et al. |
| 2010/0326189 | A1 | * | 12/2010 | Sato et al. .................. 73/504.12 |
| 2011/0080056 | A1 | | 4/2011 | Low et al. |
| 2011/0227420 | A1 | | 9/2011 | Urano |
| 2012/0242284 | A1 | | 9/2012 | Wheatley, III |

FOREIGN PATENT DOCUMENTS

| | | |
|---|---|---|
| WO | WO-2010028092 | 3/2010 |
| WO | WO-2010033727 A2 | 3/2010 |
| WO | WO-2012112703 A1 | 8/2012 |
| WO | WO-2013025720 | 2/2013 |

OTHER PUBLICATIONS

International Search Report and Written Opinion—PCT/US2013/039321—ISAEPO—Apr. 4, 2014.

* cited by examiner

PUSH-PULL DRIVER FOR GENERATING A SIGNAL FOR WIRELESS POWER TRANSFER

CROSS-REFERENCE TO RELATED APPLICATIONS

This application claims priority under 35 U.S.C. §119(e) to U.S. Provisional Patent Application No. 61/643,693, entitled "METHOD OF COMBINING PUSH-PULL DRIVER'S SUPPLY CHOKES USING A COMMON MODE CHOKE" and filed on May 7, 2012, the entire contents of which disclosure is herewith incorporated by reference.

FIELD

The present invention relates generally to wireless power. More specifically, the disclosure is directed to a wireless power transmitter that transfers power wirelessly.

BACKGROUND

An increasing number and variety of electronic devices are powered via rechargeable batteries. Such devices include mobile phones, portable music players, laptop computers, tablet computers, computer peripheral devices, communication devices (e.g., Bluetooth devices), digital cameras, hearing aids, and the like. While battery technology has improved, battery-powered electronic devices increasingly require and consume greater amounts of power, thereby often requiring recharging. Rechargeable devices are often charged via wired connections through cables or other similar connectors that are physically connected to a power supply. Cables and similar connectors may sometimes be inconvenient or cumbersome and have other drawbacks. Wireless charging systems that are capable of transferring power in free space to be used to charge rechargeable electronic devices or provide power to electronic devices may overcome some of the deficiencies of wired charging solutions. As such, wireless power transfer systems and methods that efficiently and safely transfer power to electronic devices are desirable.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a transmitter for transferring power wirelessly such that a waveform produced at an output node is not a substantially square waveform. The transmitter includes a first circuit configured to generate a first signal, where the first circuit includes a first inductor. The transmitter further includes a second circuit configured to generate a second signal out of phase with the first signal, where the second circuit includes a second inductor inductively coupled with the first inductor. The first inductor and the second inductor may share a node. The first inductor and the second inductor may have a leakage inductance of at least a minimum value so as to not produce the substantially square waveform at an output of the first circuit and at an output of the second circuit. The transmitter further includes a filter circuit configured to filter the first signal and the second signal, where an output of the filter circuit is configured to drive a load.

Another aspect of the disclosure provides a method for transferring power wirelessly such that a waveform produced at an output node is not a substantially square waveform. The method includes generating, by a first circuit, a first signal. The first circuit may include a first inductor. The method further includes generating, by a second circuit, a second signal out of phase with the first signal. The second circuit may include a second inductor inductively coupled with the first inductor. The first inductor and the second inductor may share a node. The first inductor and the second inductor may have a leakage inductance of at least a minimum value so as to not produce the substantially square waveform at an output of the first circuit and at an output of the second circuit. The method further includes filtering the first signal and the second signal. The method further includes driving a load based on the filtered first signal and the filtered second signal.

Another aspect of the disclosure provides an apparatus for transferring power wirelessly such that a waveform produced at an output node is not a substantially square waveform. The apparatus includes means for generating a first signal. The means for generating the first signal may include a first means for storing energy in a magnetic field. The apparatus further includes means for generating a second signal out of phase with the first signal. The means for generating the second signal may include a second means for storing energy in a magnetic field inductively coupled with the first means for storing energy in a magnetic field. The first means for storing energy in a magnetic field and the second means for storing energy in a magnetic field may share a node. The first means for storing energy in a magnetic field and the second means for storing energy in a magnetic field may have a leakage inductance of at least a minimum value so as to not produce the substantially square waveform at an output of the means for generating the first signal and at an output of the means for generating the second signal. The apparatus further includes means for filtering the first signal and the second signal. The apparatus further includes means for driving a load based on the filtered first signal and the filtered second signal.

Another aspect of the disclosure provides a non-transitory computer-readable medium comprising code that, when executed, causes an apparatus to generate, by a first circuit, a first signal. The first circuit may include a first inductor. The medium further comprises code that, when executed, causes an apparatus to generate, by a second circuit, a second signal out of phase with the first signal. The second circuit may include a second inductor inductively coupled with the first inductor. The first inductor and the second inductor may share a node. The first inductor and the second inductor may have a leakage inductance of at least a minimum so as to not produce a substantially square waveform at an output of the first circuit and at an output of the second circuit. The medium further comprises code that, when executed, causes an apparatus to filter the first signal and the second signal. The medium further comprises code that, when executed, causes an apparatus to drive a load based on the filtered first signal and the filtered second signal.

Figure 1:
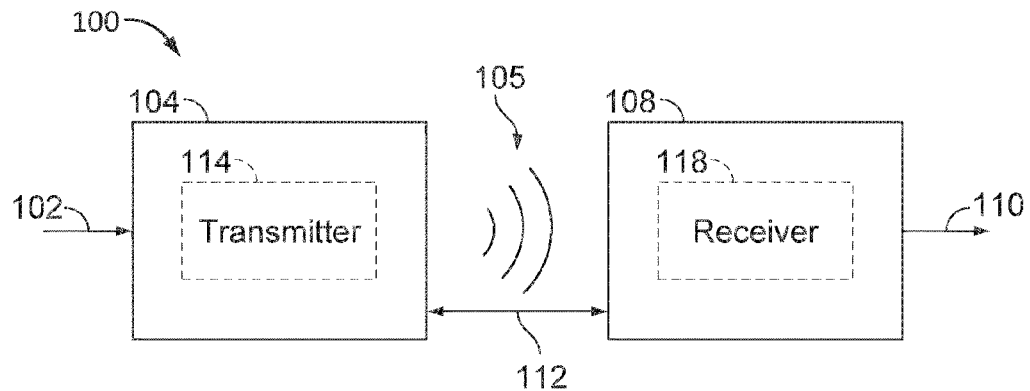
FIG. 1 is a functional block diagram of an exemplary wireless power transfer system, in accordance with exemplary embodiments.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary embodiments of the invention and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving coil" to achieve power transfer.

FIG. 1 is a functional block diagram of an exemplary wireless power transfer system 100, in accordance with exemplary embodiments. Input power 102 may be provided to a transmitter 104 from a power source (not shown) for generating a field 105 for providing energy transfer. A receiver 108 may couple to the field 105 and generate output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship. When the resonant frequency of receiver 108 and the resonant frequency of transmitter 104 are substantially the same or very close, transmission losses between the transmitter 104 and the receiver 108 are minimal. As such, wireless power transfer may be provided over larger distance in contrast to purely inductive solutions that may require large coils that require coils to be very close (e.g., mms). Resonant inductive coupling techniques may thus allow for improved efficiency and power transfer over various distances and with a variety of inductive coil configurations.

The receiver 108 may receive power when the receiver 108 is located in an energy field 105 produced by the transmitter 104. The field 105 corresponds to a region where energy output by the transmitter 104 may be captured by a receiver 105. In some cases, the field 105 may correspond to the "near-field" of the transmitter 104 as will be further described below. The transmitter 104 may include a transmit coil 114 for outputting an energy transmission. The receiver 108 further includes a receive coil 118 for receiving or capturing energy from the energy transmission. The near-field may correspond to a region in which there are strong reactive fields resulting from the currents and charges in the transmit coil 114 that minimally radiate power away from the transmit coil 114. In some cases the near-field may correspond to a region that is within about one wavelength (or a fraction thereof) of the transmit coil 114. The transmit and receive coils 114 and 118 are sized according to applications and devices to be associated therewith. As described above, efficient energy transfer may occur by coupling a large portion of the energy in a field 105 of the transmit coil 114 to a receive coil 118 rather than propagating most of the energy in an electromagnetic wave to the far field. When positioned within the field 105, a "coupling mode" may be developed between the transmit coil 114 and the receive coil 118. The area around the transmit and receive coils 114 and 118 where this coupling may occur is referred to herein as a coupling-mode region.

Figure 2:
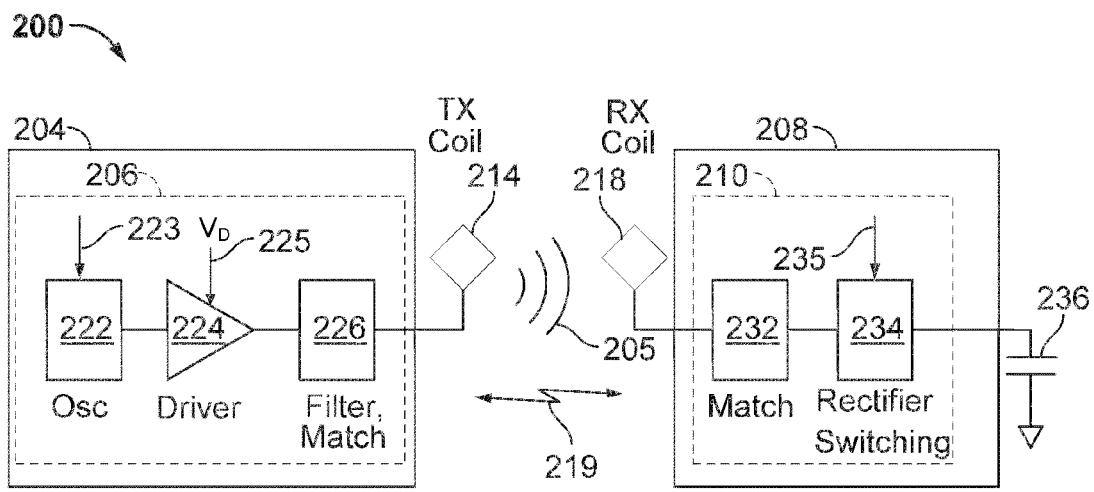
FIG. 2 is a functional block diagram of exemplary components that may be used in the wireless power transfer system of FIG. 1, in accordance with various exemplary embodiments.

FIG. 2 is a functional block diagram of exemplary components that may be used in the wireless power transfer system 100 of FIG. 1, in accordance with various exemplary embodiments. The transmitter 204 may include transmit circuitry 206 that may include an oscillator 222, a driver circuit 224, and a filter and matching circuit 226. The oscillator 222 may be configured to generate a signal at a desired frequency, such as 468.75 KHz, 6.78 MHz or 13.56 MHz, that may be adjusted in response to a frequency control signal 223. The oscillator signal may be provided to a driver circuit 224 configured to drive the transmit coil 214 at, for example, a resonant frequency of the transmit coil 214. The driver circuit 224 may be a switching amplifier configured to receive a square wave from the oscillator 222 and output a sine wave. For example, the driver circuit 224 may be a class E amplifier. A filter and matching circuit 226 may be also included to filter out harmonics or other unwanted frequencies and match the impedance of the transmitter 204 to the transmit coil 214.

The receiver 208 may include receive circuitry 210 that may include a matching circuit 232 and a rectifier and switching circuit 234 to generate a DC power output from an AC power input to charge a battery 236 as shown in FIG. 2 or to power a device (not shown) coupled to the receiver 108. The matching circuit 232 may be included to match the impedance of the receive circuitry 210 to the receive coil 218. The receiver 208 and transmitter 204 may additionally communicate on a separate communication channel 219 (e.g., Bluetooth, zigbee, cellular, etc). The receiver 208 and transmitter 204 may alternatively communicate via in-band signaling using characteristics of the wireless field 206.

As described more fully below, receiver 208, that may initially have a selectively disablable associated load (e.g., battery 236), may be configured to determine whether an amount of power transmitted by transmitter 204 and received by receiver 208 is appropriate for charging a battery 236. Further, receiver 208 may be configured to enable a load (e.g., battery 236) upon determining that the amount of power is appropriate. In some embodiments, a receiver 208 may be configured to directly utilize power received from a wireless power transfer field without charging of a battery 236. For example, a communication device, such as a near-field communication (NFC) or radio-frequency identification device (RFID may be configured to receive power from a wireless power transfer field and communicate by interacting with the wireless power transfer field and/or utilize the received power to communicate with a transmitter 204 or other devices.

Figure 3:
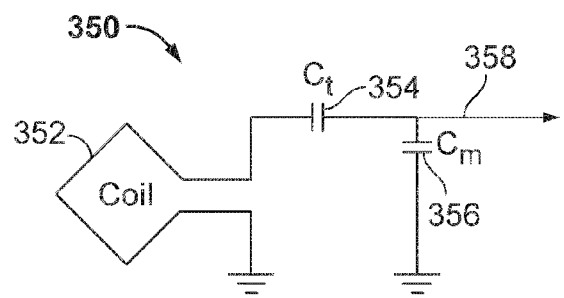
FIG. 3 is a schematic diagram of a portion of transmit circuitry or receive circuitry of FIG. 2 including a transmit or receive coil, in accordance with exemplary embodiments.

FIG. 3 is a schematic diagram of a portion of transmit circuitry 206 or receive circuitry 210 of FIG. 2 including a transmit or receive coil 352, in accordance with exemplary embodiments. As illustrated in FIG. 3, transmit or receive circuitry 350 used in exemplary embodiments may include a coil 352. The coil may also be referred to or be configured as a "loop" antenna 352. The coil 352 may also be referred to herein or be configured as a "magnetic" antenna or an induction coil. The term "coil" is intended to refer to a component that may wirelessly output or receive energy for coupling to another "coil." The coil may also be referred to as an "antenna" of a type that is configured to wirelessly output or receive power. The coil 352 may be configured to include an air core or a physical core such as a ferrite core (not shown). Air core loop coils may be more tolerable to extraneous physical devices placed in the vicinity of the core. Furthermore, an air core loop coil 352 allows the placement of other components within the core area. In addition, an air core loop may more readily enable placement of the receive coil 218 (FIG. 2) within a plane of the transmit coil 214 (FIG. 2) where the coupled-mode region of the transmit coil 214 (FIG. 2) may be more powerful.

As stated, efficient transfer of energy between the transmitter 104 and receiver 108 may occur during matched or nearly matched resonance between the transmitter 104 and the receiver 108. However, even when resonance between the transmitter 104 and receiver 108 are not matched, energy may be transferred, although the efficiency may be affected. Transfer of energy occurs by coupling energy from the field 105 of the transmitting coil to the receiving coil residing in the neighborhood where this field 105 is established rather than propagating the energy from the transmitting coil into free space.

The resonant frequency of the loop or magnetic coils is based on the inductance and capacitance. Inductance may be simply the inductance created by the coil 352, whereas, capacitance may be added to the coil's inductance to create a resonant structure at a desired resonant frequency. As a non-limiting example, capacitor 352 and capacitor 354 may be added to the transmit or receive circuitry 350 to create a resonant circuit that selects a signal 356 at a resonant frequency. Accordingly, for larger diameter coils, the size of capacitance needed to sustain resonance may decrease as the diameter or inductance of the loop increases. Furthermore, as the diameter of the coil increases, the efficient energy transfer area of the near-field may increase. Other resonant circuits formed using other components are also possible. As another non-limiting example, a capacitor may be placed in parallel between the two terminals of the coil 350. For transmit coils, a signal 358 with a frequency that substantially corresponds to the resonant frequency of the coil 352 may be an input to the coil 352.

In one embodiment, the transmitter 104 may be configured to output a time varying magnetic field with a frequency corresponding to the resonant frequency of the transmit coil 114. When the receiver is within the field 105, the time varying magnetic field may induce a current in the receive coil 118. As described above, if the receive coil 118 is configured to be resonant at the frequency of the transmit coil 118, energy may be efficiently transferred. The AC signal induced in the receive coil 118 may be rectified as described above to produce a DC signal that may be provided to charge or to power a load.

Figure 4:
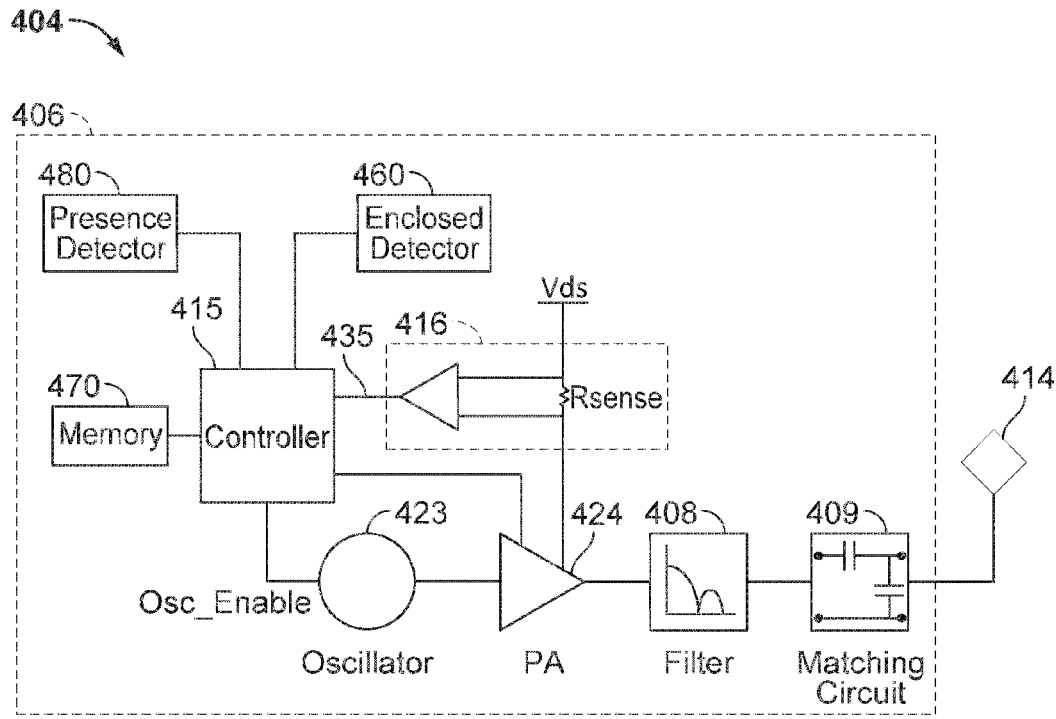
FIG. 4 is a functional block diagram of a transmitter that may be used in the wireless power transfer system of FIG. 1, in accordance with exemplary embodiments.

FIG. 4 is a functional block diagram of a transmitter 404 that may be used in the wireless power transfer system of FIG. 1, in accordance with exemplary embodiments. The transmitter 404 may include transmit circuitry 406 and a transmit coil 414. The transmit coil 414 may be the coil 352 as shown in FIG. 3. Transmit circuitry 406 may provide RF power to the transmit coil 414 by providing an oscillating signal resulting in generation of energy (e.g., magnetic flux) about the transmit coil 414. Transmitter 404 may operate at any suitable frequency. By way of example, transmitter 404 may operate at the 13.56 MHz ISM band.

Transmit circuitry 406 may include a fixed impedance matching circuit 409 for matching the impedance of the transmit circuitry 406 (e.g., 50 ohms) to the transmit coil 414 and a low pass filter (LPF) 408 configured to reduce harmonic emissions to levels to prevent self-jamming of devices coupled to receivers 108 (FIG. 1). Other exemplary embodiments may include different filter topologies, including but not limited to, notch filters that attenuate specific frequencies while passing others and may include an adaptive impedance match, that may be varied based on measurable transmit metrics, such as output power to the coil 414 or DC current drawn by the driver circuit 424. Transmit circuitry 406 further includes a driver circuit 424 configured to drive an RF signal as determined by an oscillator 423. The transmit circuitry 406 may be comprised of discrete devices or circuits, or alternately, may be comprised of an integrated assembly. An exemplary RF power output from transmit coil 414 may be on the order of 2.5 Watts.

Transmit circuitry 406 may further include a controller 415 for selectively enabling the oscillator 423 during transmit phases (or duty cycles) for specific receivers, for adjusting the frequency or phase of the oscillator 423, and for adjusting the output power level for implementing a communication protocol for interacting with neighboring devices through their attached receivers. It is noted that the controller 415 may also be referred to herein as processor 415. Adjustment of oscillator phase and related circuitry in the transmission path may allow for reduction of out of band emissions, especially when transitioning from one frequency to another.

The transmit circuitry 406 may further include a load sensing circuit 416 for detecting the presence or absence of active receivers in the vicinity of the near-field generated by transmit coil 414. By way of example, a load sensing circuit 416 monitors the current flowing to the driver circuit 424, that may be affected by the presence or absence of active receivers in the vicinity of the field generated by transmit coil 414 as will be further described below. Detection of changes to the loading on the driver circuit 424 are monitored by controller 415 for use in determining whether to enable the oscillator 423 for transmitting energy and to communicate with an active receiver. As described more fully below, a current measured at the driver circuit 424 may be used to determine whether an invalid device is positioned within a wireless power transfer region of the transmitter 404.

The transmit coil 414 may be implemented with a Litz wire or as an antenna strip with the thickness, width and metal type selected to keep resistive losses low. In a one implementation, the transmit coil 414 may generally be configured for association with a larger structure such as a table, mat, lamp or other less portable configuration. Accordingly, the transmit coil 414 generally may not need "turns" in order to be of a practical dimension. An exemplary implementation of a transmit coil 414 may be "electrically small" (i.e., fraction of the wavelength) and tuned to resonate at lower usable frequencies by using capacitors to define the resonant frequency.

The transmitter 404 may gather and track information about the whereabouts and status of receiver devices that may be associated with the transmitter 404. Thus, the transmit circuitry 406 may include a presence detector 480, an enclosed detector 460, or a combination thereof, connected to the controller 415 (also referred to as a processor herein). The controller 415 may adjust an amount of power delivered by the driver circuit 424 in response to presence signals from the presence detector 480 and the enclosed detector 460. The transmitter 404 may receive power through a number of power sources, such as, for example, an AC-DC converter (not shown) to convert conventional AC power present in a building, a DC-DC converter (not shown) to convert a conventional DC power source to a voltage suitable for the transmitter 404, or directly from a conventional DC power source (not shown).

As a non-limiting example, the presence detector 480 may be a motion detector utilized to sense the initial presence of a device to be charged that is inserted into the coverage area of the transmitter 404. After detection, the transmitter 404 may be turned on and the RF power received by the device may be used to toggle a switch on the Rx device in a pre-determined manner, which in turn results in changes to the driving point impedance of the transmitter 404.

As another non-limiting example, the presence detector 480 may be a detector capable of detecting a human, for example, by infrared detection, motion detection, or other suitable means. In some exemplary embodiments, there may be regulations limiting the amount of power that a transmit coil 414 may transmit at a specific frequency. In some cases, these regulations are meant to protect humans from electromagnetic radiation. However, there may be environments where a transmit coil 414 is placed in areas not occupied by humans, or occupied infrequently by humans, such as, for example, garages, factory floors, shops, and the like. If these environments are free from humans, it may be permissible to increase the power output of the transmit coil 414 above the normal power restrictions regulations. In other words, the controller 415 may adjust the power output of the transmit coil 414 to a regulatory level or lower in response to human presence and adjust the power output of the transmit coil 414 to a level above the regulatory level when a human is outside a regulatory distance from the electromagnetic field of the transmit coil 414.

As a non-limiting example, the enclosed detector 460 (may also be referred to herein as an enclosed compartment detector or an enclosed space detector) may be a device such as a sense switch for determining when an enclosure is in a closed or open state. When a transmitter is in an enclosure that is in an enclosed state, a power level of the transmitter may be increased.

In exemplary embodiments, a method by which the transmitter 404 does not remain on indefinitely may be used. In this case, the transmitter 404 may be programmed to shut off after a user-determined amount of time. This feature prevents the transmitter 404, notably the driver circuit 424, from running long after the wireless devices in its perimeter are fully charged. This event may be due to the failure of the circuit to detect the signal sent from either the repeater or the receive coil that a device is fully charged. To prevent the transmitter 404 from automatically shutting down if another device is placed in its perimeter, the transmitter 404 automatic shut off feature may be activated only after a set period of lack of motion detected in its perimeter. The user may be able to determine the inactivity time interval, and change it as desired. As a non-limiting example, the time interval may be longer than that needed to fully charge a specific type of wireless device under the assumption of the device being initially fully discharged.

Figure 5:
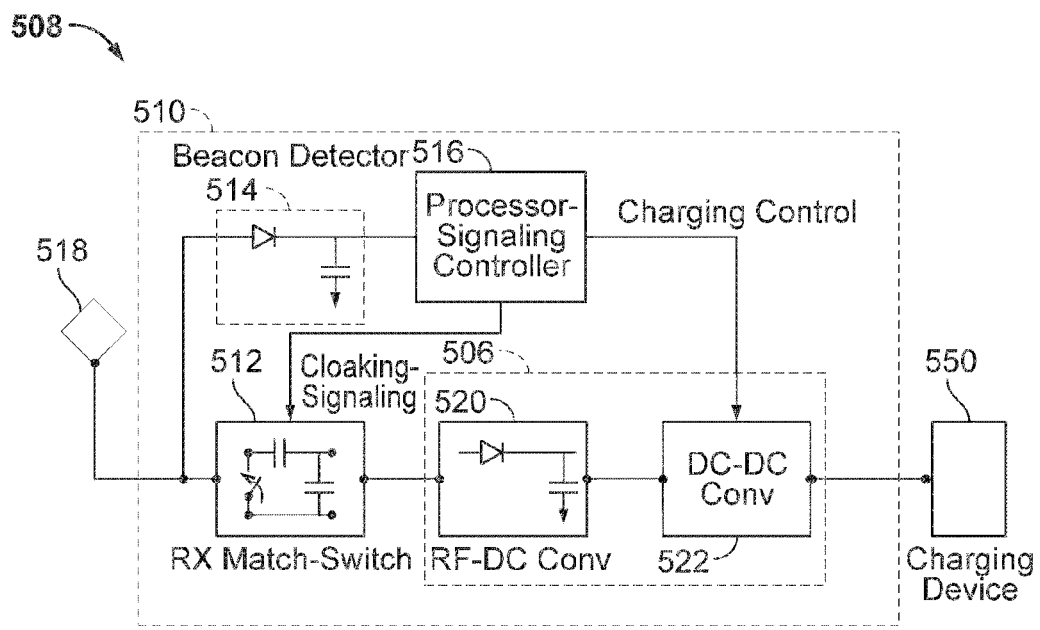
FIG. 5 is a functional block diagram of a receiver that may be used in the wireless power transfer system of FIG. 1, in accordance with exemplary embodiments.

FIG. 5 is a functional block diagram of a receiver 508 that may be used in the wireless power transfer system of FIG. 1, in accordance with exemplary embodiments. The receiver 508 includes receive circuitry 510 that may include a receive coil 518. Receiver 508 further couples to device 550 for providing received power thereto. It should be noted that receiver 508 is illustrated as being external to device 550 but may be integrated into device 550. Energy may be propagated wirelessly to receive coil 518 and then coupled through the rest of the receive circuitry 510 to device 550. By way of example, the charging device may include devices such as mobile phones, portable music players, laptop computers, tablet computers, computer peripheral devices, communication devices (e.g., Bluetooth devices), digital cameras, hearing aids (an other medical devices), and the like.

Receive coil 518 may be tuned to resonate at the same frequency, or within a specified range of frequencies, as transmit coil 414 (FIG. 4). Receive coil 518 may be similarly dimensioned with transmit coil 414 or may be differently sized based upon the dimensions of the associated device 550. By way of example, device 550 may be a portable electronic device having diametric or length dimension smaller that the diameter of length of transmit coil 414. In such an example, receive coil 518 may be implemented as a multi-turn coil in order to reduce the capacitance value of a tuning capacitor (not shown) and increase the receive coil's impedance. By way of example, receive coil 518 may be placed around the substantial circumference of device 550 in order to maximize the coil diameter and reduce the number of loop turns (i.e., windings) of the receive coil 518 and the inter-winding capacitance.

Receive circuitry 510 may provide an impedance match to the receive coil 518. Receive circuitry 510 includes power conversion circuitry 506 for converting a received RF energy source into charging power for use by the device 550. Power conversion circuitry 506 includes an RF-to-DC converter 520 and may also in include a DC-to-DC converter 522. RF-to-DC converter 520 rectifies the RF energy signal received at receive coil 518 into a non-alternating power with an output voltage represented by $V_{rect}$. The DC-to-DC converter 522 (or other power regulator) converts the rectified RF energy signal into an energy potential (e.g., voltage) that is compatible with device 550 with an output voltage and output current represented by $V_{out}$ and $I_{out}$. Various RF-to-DC converters are contemplated, including partial and full rectifiers, regulators, bridges, doublers, as well as linear and switching converters.

Receive circuitry 510 may further include switching circuitry 512 for connecting receive coil 518 to the power conversion circuitry 506 or alternatively for disconnecting the power conversion circuitry 506. Disconnecting receive coil 518 from power conversion circuitry 506 not only suspends charging of device 550, but also changes the "load" as "seen" by the transmitter 404 (FIG. 2).

As disclosed above, transmitter 404 includes load sensing circuit 416 that may detect fluctuations in the bias current provided to transmitter driver circuit 424. Accordingly, transmitter 404 has a mechanism for determining when receivers are present in the transmitter's near-field.

When multiple receivers 508 are present in a transmitter's near-field, it may be desirable to time-multiplex the loading and unloading of one or more receivers to enable other receivers to more efficiently couple to the transmitter. A receiver 508 may also be cloaked in order to eliminate coupling to other nearby receivers or to reduce loading on nearby transmitters. This "unloading" of a receiver is also known herein as a "cloaking." Furthermore, this switching between unloading and loading controlled by receiver 508 and detected by transmitter 404 may provide a communication mechanism from receiver 508 to transmitter 404 as is explained more fully below. Additionally, a protocol may be associated with the switching that enables the sending of a message from receiver 508 to transmitter 404. By way of example, a switching speed may be on the order of 100 µsec.

In an exemplary embodiment, communication between the transmitter 404 and the receiver 508 refers to a device sensing and charging control mechanism, rather than conventional two-way communication (i.e., in band signaling using the coupling field). In other words, the transmitter 404 may use on/off keying of the transmitted signal to adjust whether energy is available in the near-field. The receiver may interpret these changes in energy as a message from the transmitter 404. From the receiver side, the receiver 508 may use tuning and de-tuning of the receive coil 518 to adjust how much power is being accepted from the field. In some cases, the tuning and de-tuning may be accomplished via the switching circuitry 512. The transmitter 404 may detect this difference in power used from the field and interpret these changes as a message from the receiver 508. It is noted that other forms of modulation of the transmit power and the load behavior may be utilized.

Receive circuitry 510 may further include signaling detector and beacon circuitry 514 used to identify received energy fluctuations, that may correspond to informational signaling from the transmitter to the receiver. Furthermore, signaling and beacon circuitry 514 may also be used to detect the transmission of a reduced RF signal energy (i.e., a beacon signal) and to rectify the reduced RF signal energy into a nominal power for awakening either un-powered or power-depleted circuits within receive circuitry 510 in order to configure receive circuitry 510 for wireless charging.

Receive circuitry 510 further includes processor 516 for coordinating the processes of receiver 508 described herein including the control of switching circuitry 512 described herein. Cloaking of receiver 508 may also occur upon the occurrence of other events including detection of an external wired charging source (e.g., wall/USB power) providing charging power to device 550. Processor 516, in addition to controlling the cloaking of the receiver, may also monitor beacon circuitry 514 to determine a beacon state and extract messages sent from the transmitter 404. Processor 516 may also adjust the DC-to-DC converter 522 for improved performance.

Figure 6:
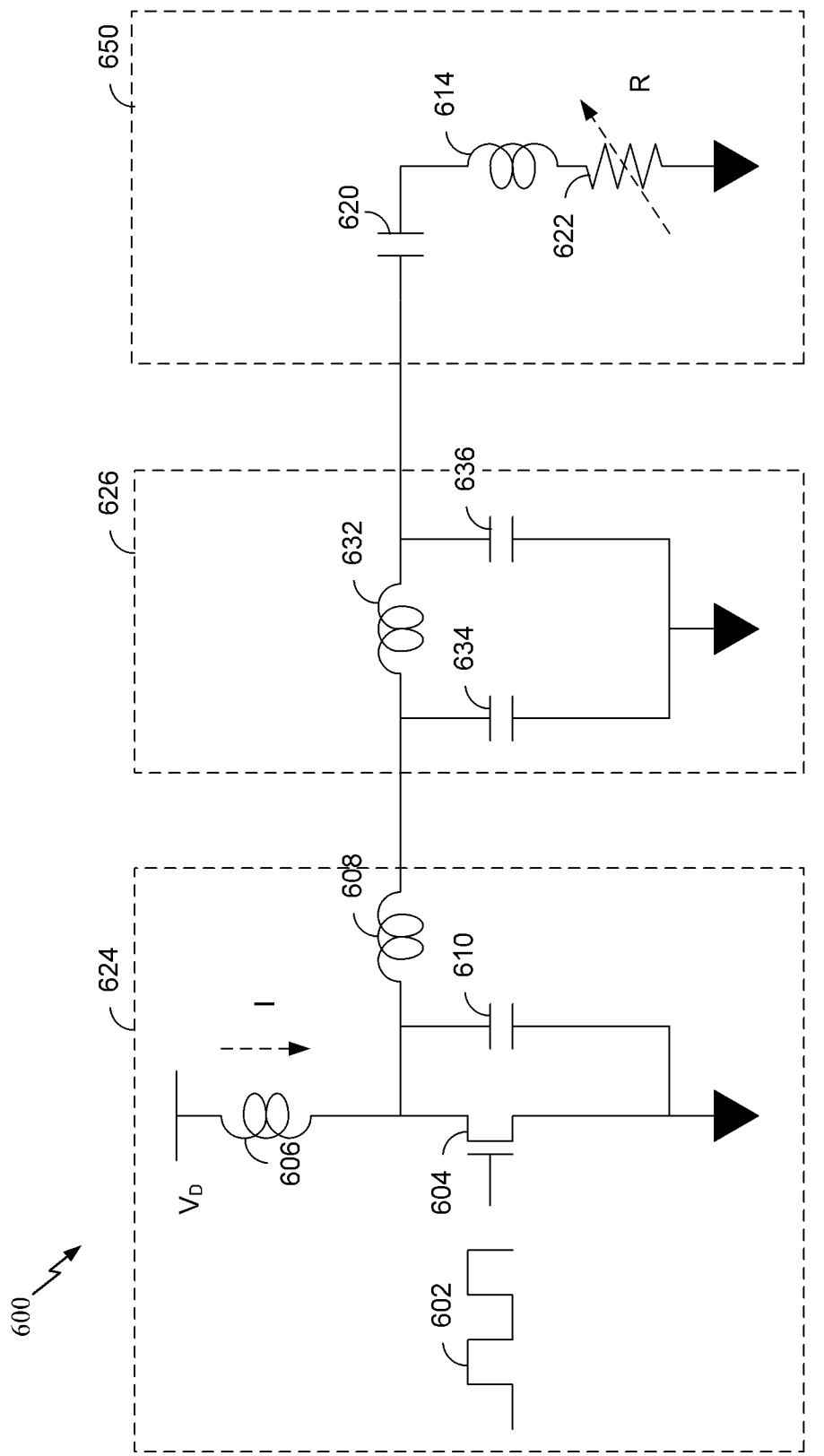
FIG. 6 is a schematic diagram of a portion of transmit circuitry that may be used in the transmit circuitry of FIG. 4.

FIG. 6 is a schematic diagram of a portion of transmit circuitry 600 that may be used in the transmit circuitry 406 of FIG. 4. The transmit circuitry 600 may include a driver circuit 624 as described above in FIG. 4. As described above, driver circuit 624 may be a switching amplifier that may be configured to receive a square wave and output a sine wave to be provided to the transmit circuit 650. In some cases the driver circuit 624 may be referred to as an amplifier circuit. The driver circuit 624 is shown as a class E amplifier, however, any suitable driver circuit 624 may be used in accordance with embodiments. The driver circuit 624 may be driven by an input signal 602 from an oscillator 423 as shown in FIG. 4. The driver circuit 624 may also be provided with a drive voltage $V_D$ that is configured to control the maximum power that may be delivered through a transmit circuit 650. To eliminate or reduce harmonics, the transmit circuitry 600 may include a filter circuit 626. The filter circuit 626 may be a three pole (capacitor 634, inductor 632, and capacitor 636) low pass filter circuit 626.

The signal output by the filter circuit 626 may be provided to a transmit circuit 650 comprising a coil 614. The transmit circuit 650 may include a series resonant circuit having a capacitance 620 and inductance (e.g., that may be due to the inductance or capacitance of the coil or to an additional capacitor component) that may resonate at a frequency of the filtered signal provided by the driver circuit 624. The load of the transmit circuit 650 may be represented by the variable resistor 622. The load may be a function of a wireless power receiver 508 that is positioned to receive power from the transmit circuit 650.

One aspect of the disclosure provides a device, such as a transmitter for transmitting power wirelessly. The transmitter comprises a first circuit configured to generate a first signal. The transmitter further comprises a second circuit configured to generate a second signal out of phase with the first signal. The first circuit and the second circuit are coupled to a filter circuit, the output of which drives a load.

Figure 7:
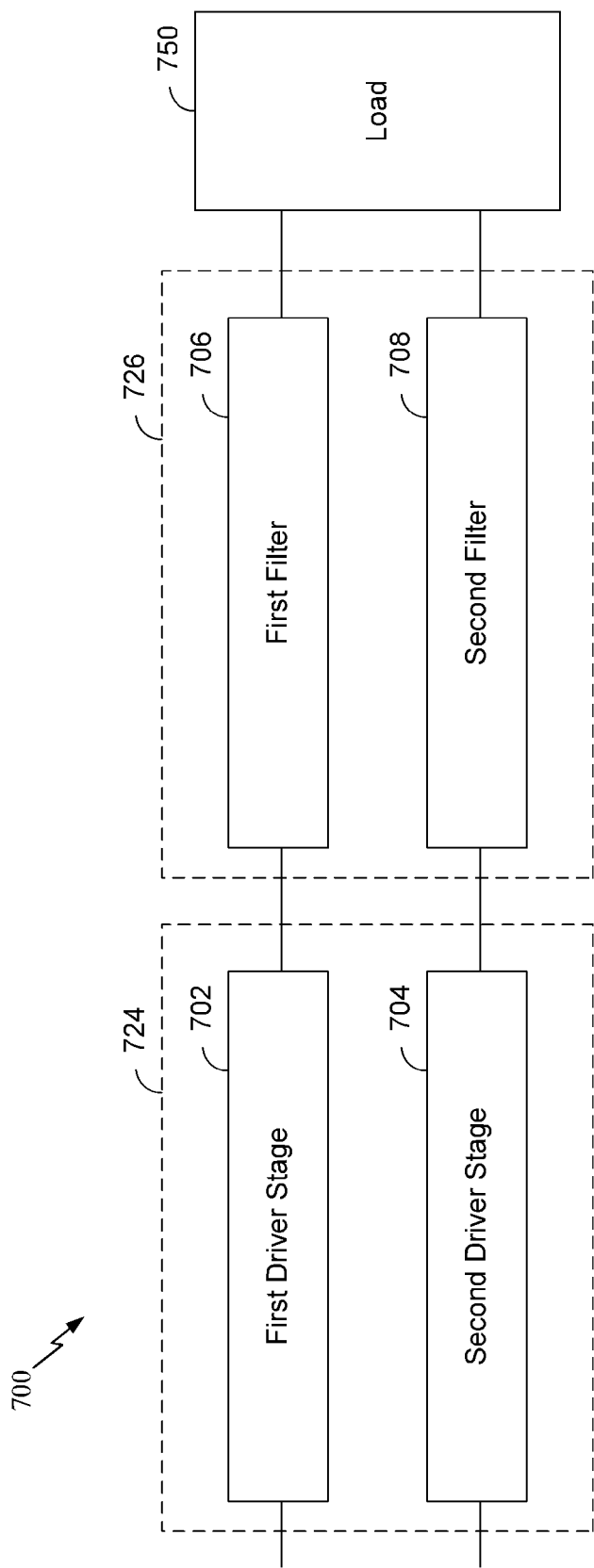
FIG. 7 is a functional block diagram of a portion of a wireless power transmitter that may be used in the wireless power transfer system of FIG. 1, in accordance with exemplary embodiments.

FIG. 7 is a functional block of a portion of a wireless power transmitter 700 that may be used in the wireless power transfer system of FIG. 1. The transmitter 700 may include the driver circuit 724, a filter circuit 726, and a load 750. In some aspects, the driver circuit 724 may replace, for example, driver circuit 624 of FIG. 6, the filter circuit 726 may replace, for example, filter circuit 626 of FIG. 6, and the load 750 may replace, for example, load 650 of FIG. 6. Note that in other aspects, the driver circuit 724, filter circuit 726, and/or load 750 need not be limited to wireless power transmitters, and may be employed in any suitable circuit or device.

Driver circuit 724 may include a first driver stage 702 and a second driver stage 704. First driver stage 702 and second driver stage 704 may be driven by one or more input signals from an oscillator 423 as shown in FIG. 4. In some embodiments, the first driver stage 702 and the second driver stage 704 may be driven by one or more input signals that are out of phase with each other.

Filter circuit 726 may include first filter 706 and/or second filter 708. Note that while two separate filters 706 and 708 are depicted in FIG. 7, this is not meant to be limiting and filter circuit 726 may include any number of filters. In some embodiments, a signal produced by the first driver stage 702 may pass through first filter 706 and a signal produced by the second driver stage 704 may pass through second filter 708. Once filtered, the signals may pass to a load 750. Note that, as described herein, the filter circuit 726 may be optional. In some embodiments, the signal produced by the first driver stage 702 and the second drive stage 704 may directly drive the load 750. For example, the filter circuit 726 may be optional if the driver circuit 724 reduces EMI sufficiently so as to meet regulatory requirements.

Figure 8A:
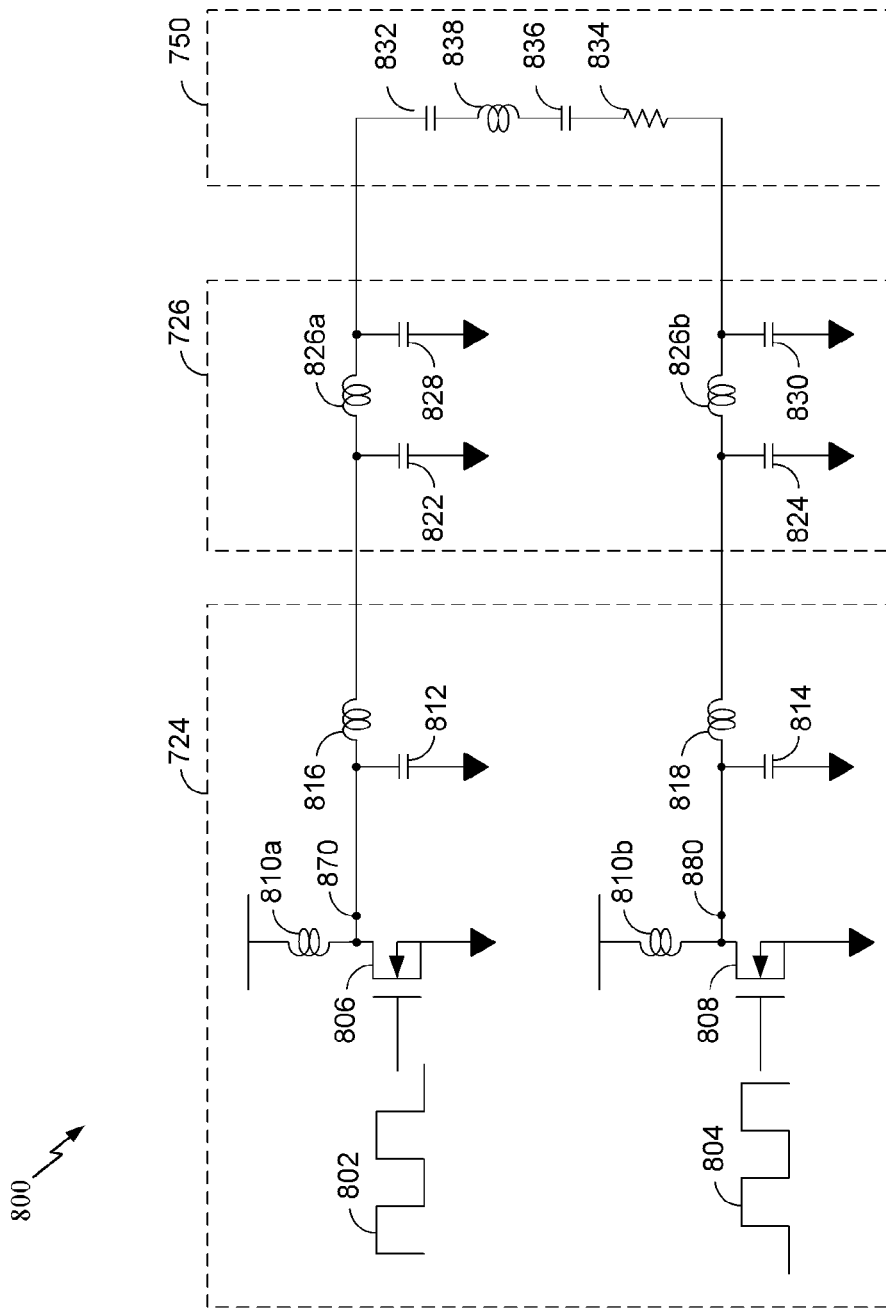
FIGS. 8A-B are schematic diagrams of a driver, a filter, and a load that may be used in the wireless power transmitter of FIG. 7.
Figure 8B:
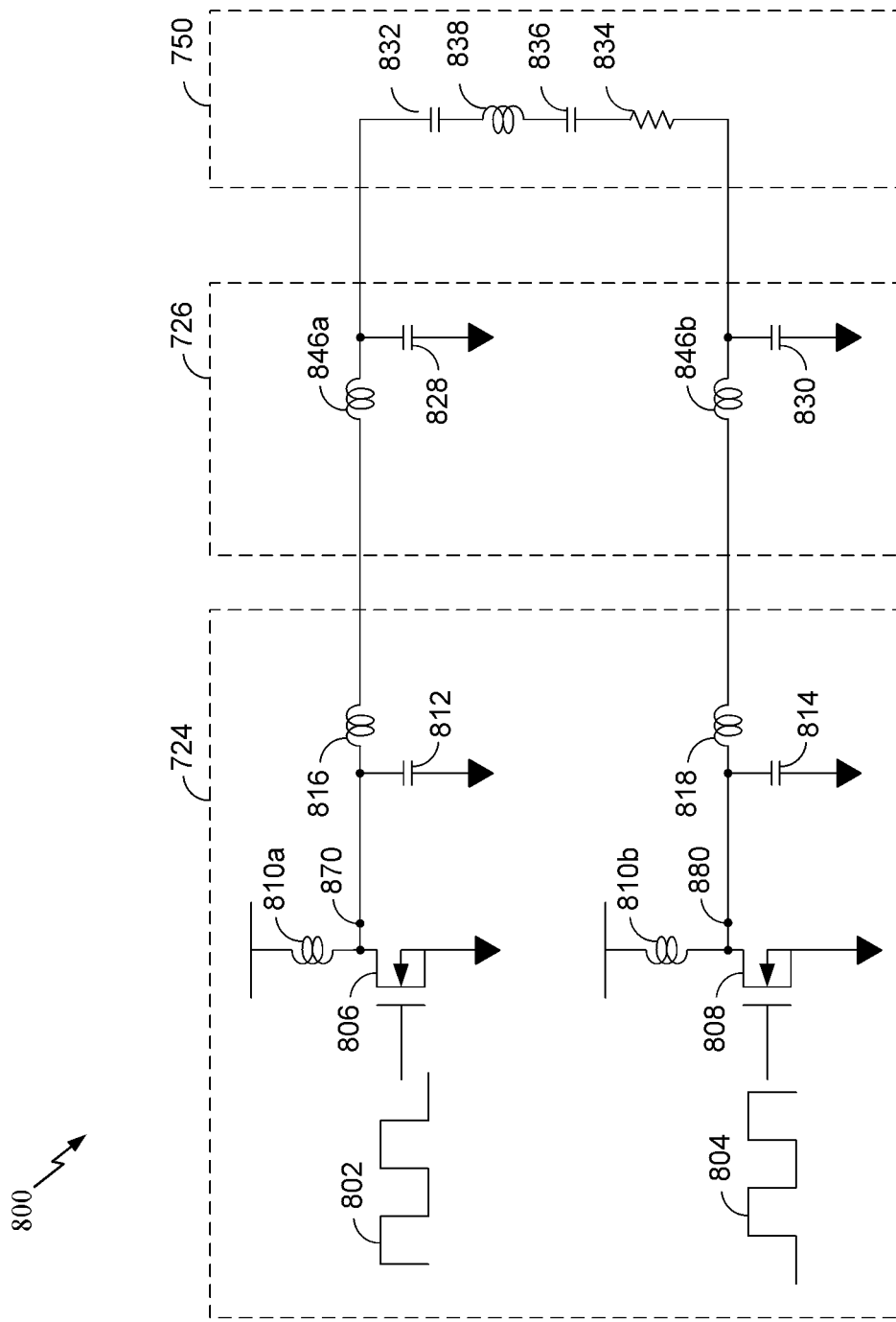

FIGS. 8A-B illustrate a schematic diagram 800 of a driver circuit 724, a filter circuit 726, and a load 750 that may be used in the wireless power transmitter 700 of FIG. 7. In some embodiments, as illustrated in FIG. 8A, the driver circuit 724 may include a transistor 806, inductors 810*a* and/or 816, and/or capacitor 812, which together may comprise the first driver stage 702 of FIG. 7. The driver circuit 724 may further include a transistor 808, inductors 810*b* and/or 818, and/or capacitor 814, which together may comprise the second driver stage 704 of FIG. 7. In another embodiment, as illustrated in FIG. 8B, the driver circuit 724 may include a transistor 806, inductors 810*a* and/or 816, and/or capacitor 812, which together may comprise the first driver stage 702 of FIG. 7. The driver circuit 724 may further include a transistor 808, inductors 810*b* and/or 818, and/or capacitor 814, which together may comprise the second driver stage 704 of FIG. 7. In other embodiments, not shown, the schematic diagram 800 may include a power supply, the filter circuit 726, and the load 750. The power supply may include a first circuit and a second circuit, such as the first driver stage 702 and the second driver stage 704.

In an embodiment, the transistor 806 may be driven by an input signal 802. The inductor 810*a* may be coupled to the drain of the transistor 806 at an output node 870 and may be considered a choke inductor. The inductor 810*a* may also be coupled to a positive voltage supply. Likewise, the transistor 808 may be driven by an input signal 804 of a different phase as the input signal 802 that drives the transistor 806 such that transistors 806 and 808 are driven out of phase. The inductor 810*b* may be coupled to the drain of the transistor 808 at an output node 880 and may be considered a choke inductor. The inductor 810*b* may also be coupled to a positive voltage supply. The source of the transistor 806 and the source of the transistor 808 may be coupled to ground. Alternatively, the inductor 810*a* and the inductor 810*b* may be coupled to ground (instead of a positive voltage supply), and the source of the transistor 806 and the source of the transistor 808 may be coupled to a negative voltage supply.

The filter circuit 726 may function to filter harmonics and/or reduce EMI. For example, the filter circuit 726 may be a low pass filter. The filter circuit 726 may include a first filter 706 and/or a second filter 708. In some embodiments, as illustrated in FIG. 8A, the first filter 706 may include an inductor 826*a* and/or capacitors 822 and/or 828. The second filter 708 may include an inductor 826*b* and/or capacitors 824 and/or 830. In other embodiments, as illustrated in FIG. 8B, the first filter 706 may include an inductor 846*a* and/or capacitor 828. The second filter 708 may include an inductor 846*b* and/or capacitor 830. As an example, inductor 846*a* illustrated in FIG. 8B may have the same or nearly the same inductance as the inductor 816 illustrated in FIG. 8B. Likewise, inductor 846*b* illustrated in FIG. 8B may have the same or nearly the same inductance as the inductor 818 illustrated in FIG. 8B.

In some embodiments, not shown, an additional inductor may be located to the right of the capacitor 828 (e.g., in parallel with capacitor 828) and an additional inductor may be located to the right of the capacitor 830 (e.g., in parallel with capacitor 830). In this way, the filter circuit 726 may resemble a "T" network filter. However, the inductance of the additional inductors may be combined with the elements of the load 750 in order to save space by using a fewer number of inductors.

In an embodiment, the first filter 706 and/or the second filter 708 of FIGS. 8A-B may include any number of inductors and capacitors. In some embodiments, a signal produced by the first driver stage 702 may pass through the first filter 706 and a signal produced by the second driver stage 704 may pass through the second filter 708. Once filtered, the signals may pass to the load 750.

In an embodiment, the load 750 may include capacitors 832 and/or 836, inductor 838, and/or resistor 834.

In some embodiments, the choke inductor 810*a* may be inductively coupled to the choke inductor 810*b* to allow for reductions in the size and/or cost of the transmitter or other device. For example, two or more inductors may be inductively coupled by interleaving their core material. As another example, two or more inductors may be inductively coupled by winding them around the same core material. In other words, the choke inductor 810*a* and the choke inductor 810*b* collectively may be replaced by a common mode choke. In some embodiments, because a current in the first driver stage 702 is out of phase with a current in the second driver stage 704, the choke inductor 810*a* or the choke inductor 810*b* may be connected in a reverse direction to achieve rejection. In other embodiments, a direction of the winding of the choke inductor 810*a* or the choke inductor 810*b* may be reversed.

In some embodiments, the choke inductor 810*a* and the choke inductor 810*b* may include a leakage inductance. For example, the leakage inductance may be at least 0.3 μH. In some aspects, the leakage inductance may be at least above between 20 μH and 30 μH, above 50 μH (e.g., 80 μH), or above 100 μH. As another example, the leakage inductance may be at least a value determined by a type of filter circuit coupled to the driver circuit 724 (or power supply).

Generally, inductors may consume a large amount of power in a transmitter or other device, and large inductors may be needed to filter harmonics and/or reduce EMI. However, by making use of mutual inductance, the effective size of the inductors, such as the choke inductors 810*a* and 810*b*, may be doubled without a change in the actual size of the inductors. In this way, a size of the choke inductors 810*a* and 810*b* may be reduced to achieve the same level of EMI reduction. Inductive coupling may also improve efficiency. Note that efficiency of the driver circuit 724 may be independent of the size of the choke inductor 810*a* and/or the choke inductor 810*b*. Likewise, the output power of the driver circuit 724 may be independent of the size of the choke inductor 810*a* and/or the choke inductor 810*b*.

Figure 9:
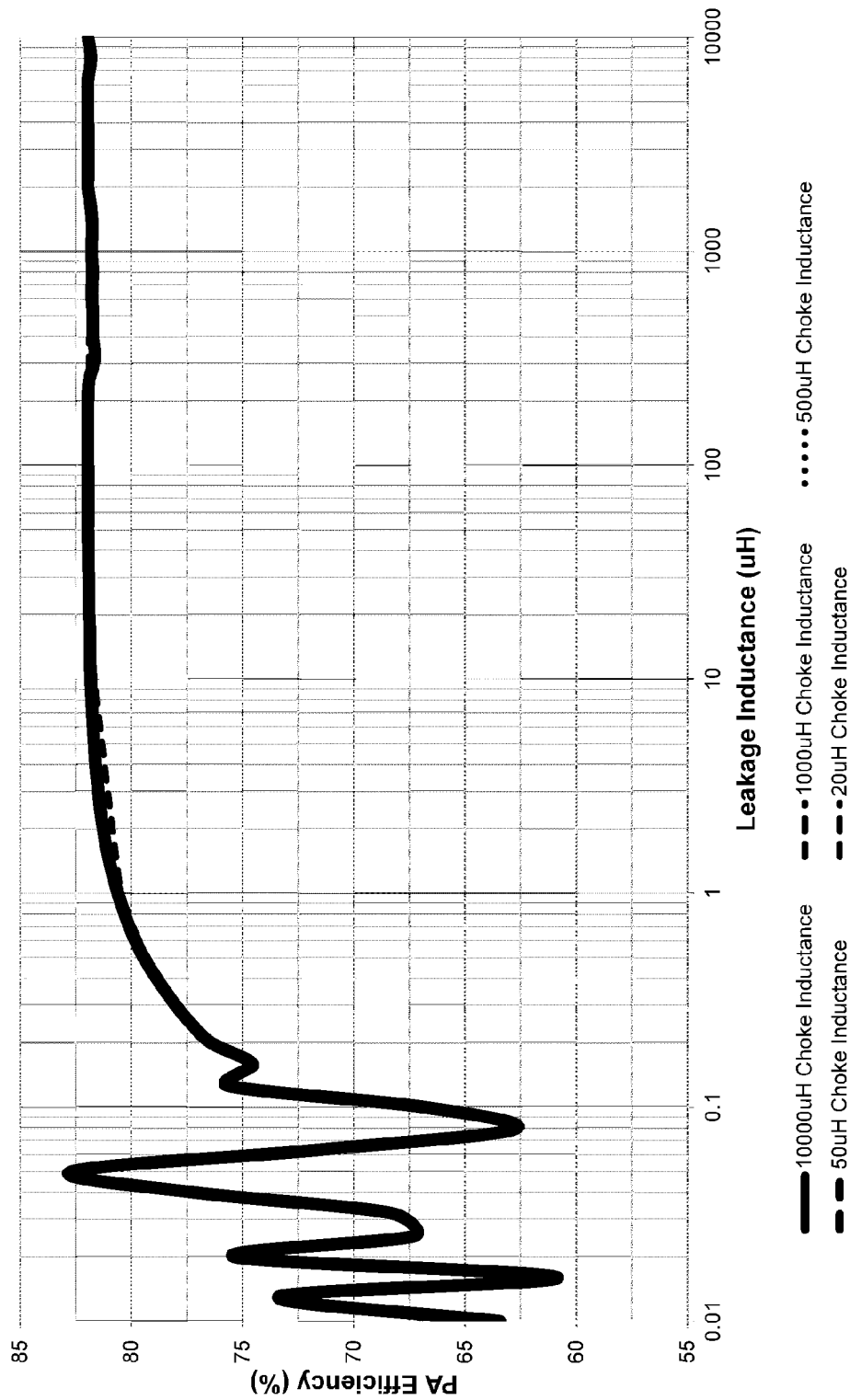
FIG. 9 is an embodiment of a graph illustrating efficiency of the driver circuit of FIGS. 8A-B as a function of leakage inductance.

FIG. 9 is an embodiment of a graph 900 illustrating efficiency of the driver circuit of FIGS. 8A-B as a function of leakage inductance. Graph 900 illustrates the efficiency of the driver circuit 724 as the leakage inductance is increased for choke inductors 810*a* and/or 810*b* of various sizes. For example, graph 900 illustrates the efficiency of the driver circuit 724 as the leakage inductance is increased for a choke inductor 810*a* and/or 810*b* of 20 μH, 50 μH, 500 μH, 1000 μH, and 10,000 μH. In an embodiment, as illustrated, the efficiency of the driver circuit 724 is independent of the size of the choke inductors 810*a* and/or 810*b*. When the leakage inductance is low (e.g., less than 0.3 μH), the efficiency oscillates. As the leakage inductance increases (e.g., past 0.3 μH), the efficiency begins to rise and stabilize.

Figure 10:
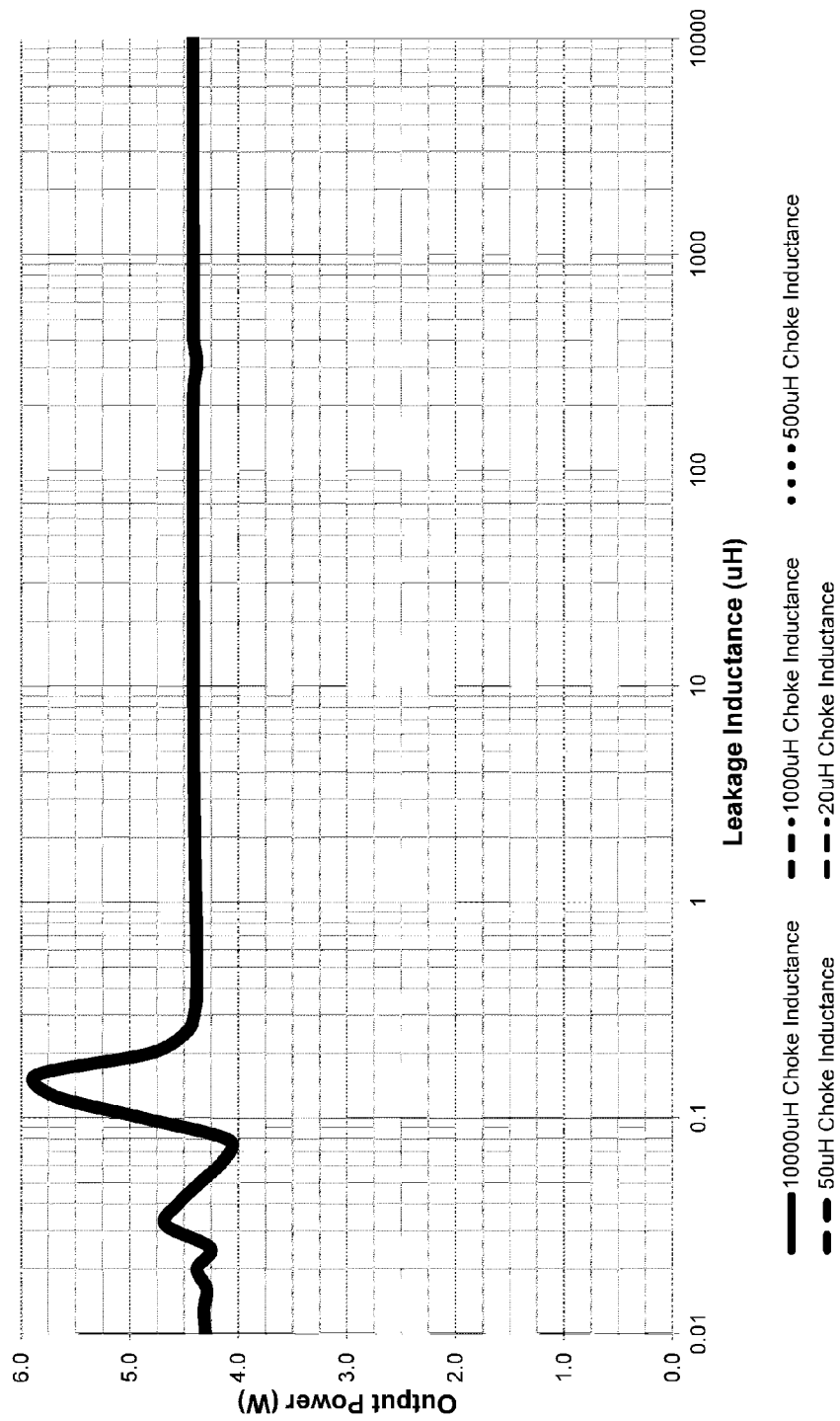
FIG. 10 is an embodiment of a graph illustrating power output of the driver circuit of FIG. 8-B as a function of leakage inductance.
Figure 11A:
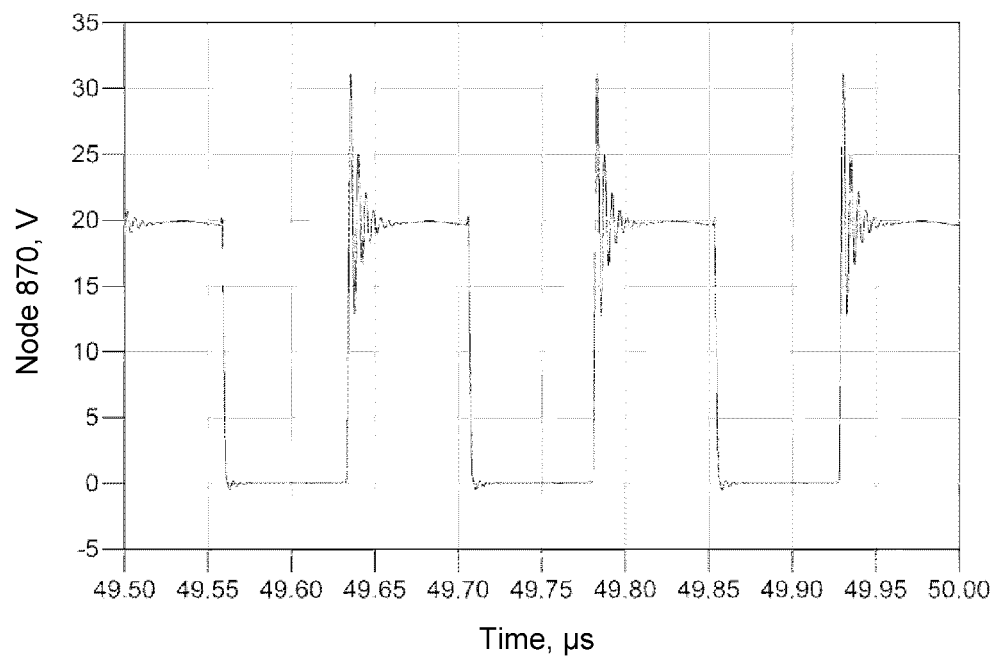
FIGS. 11A-F are embodiments of graphs illustrating voltage at a drain of a transistor of the driver circuit of FIGS. 8A-B as a function of time.
Figure 11B:
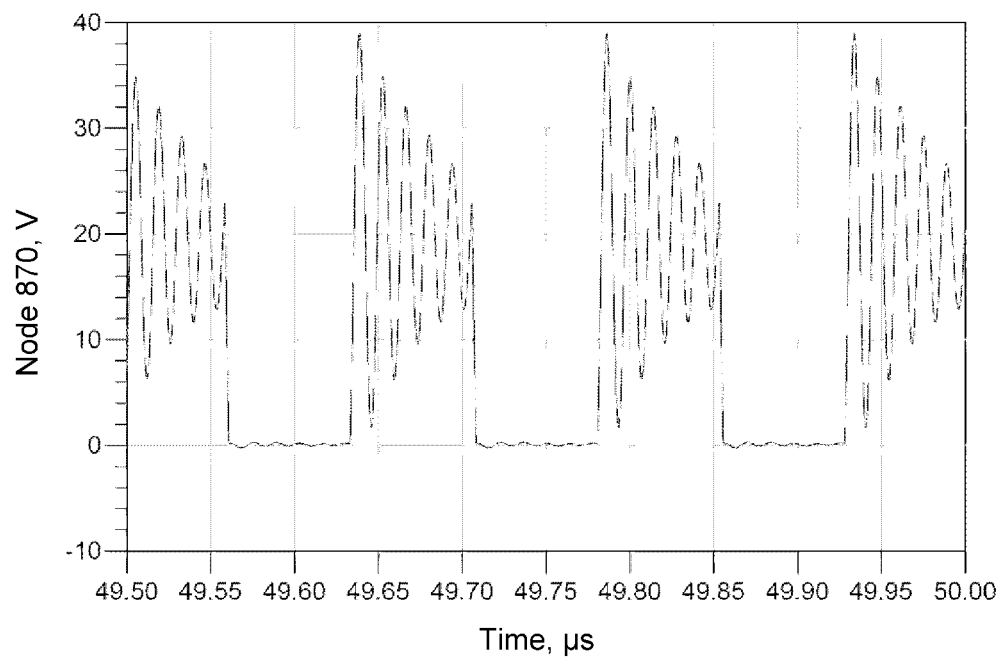
Figure 11C:
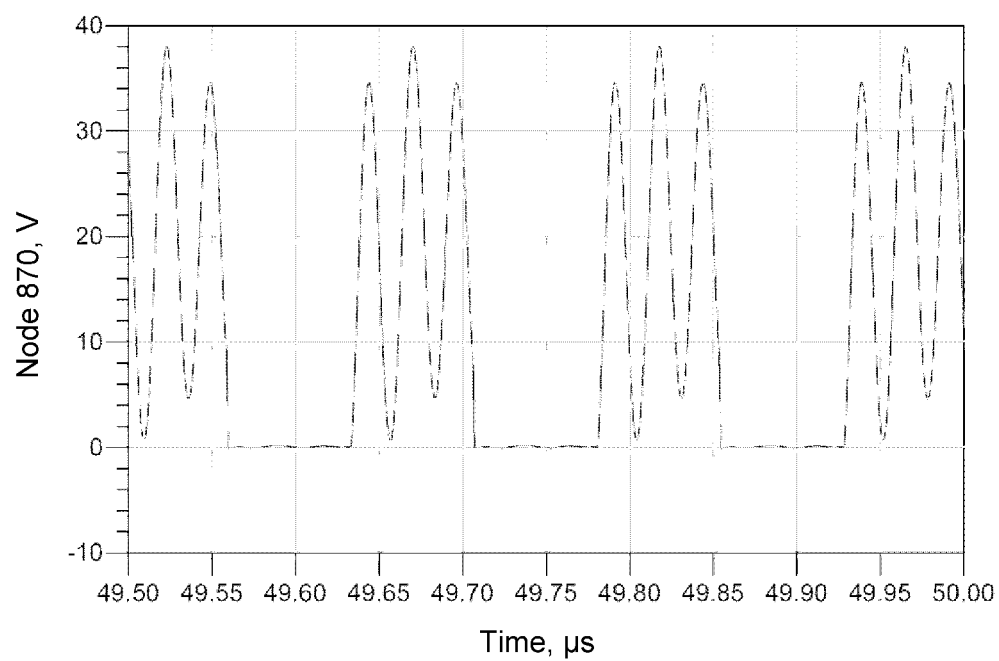
Figure 11D:
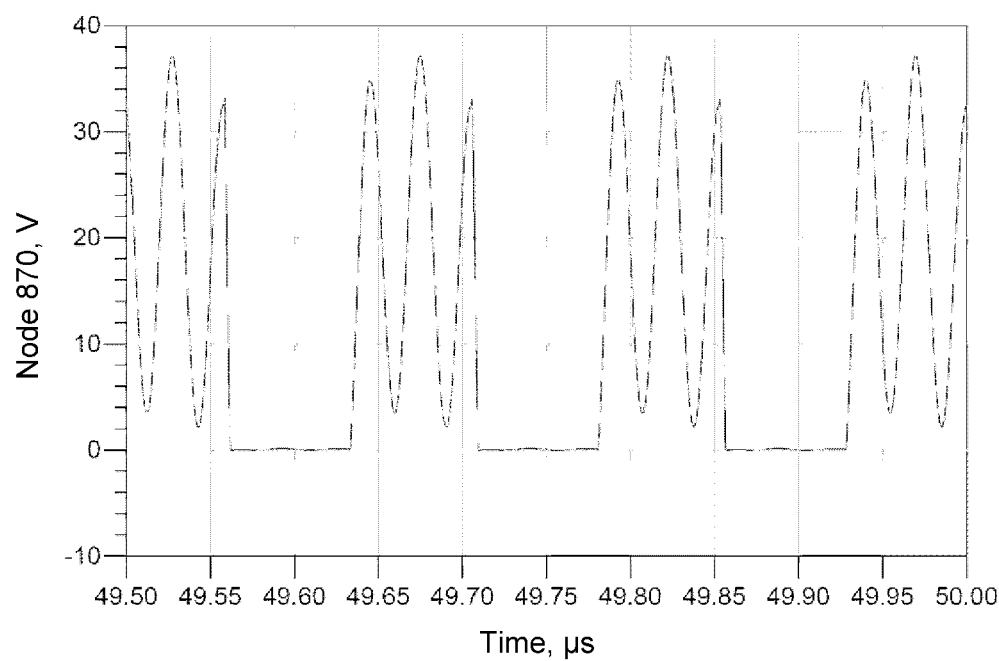
Figure 11E:
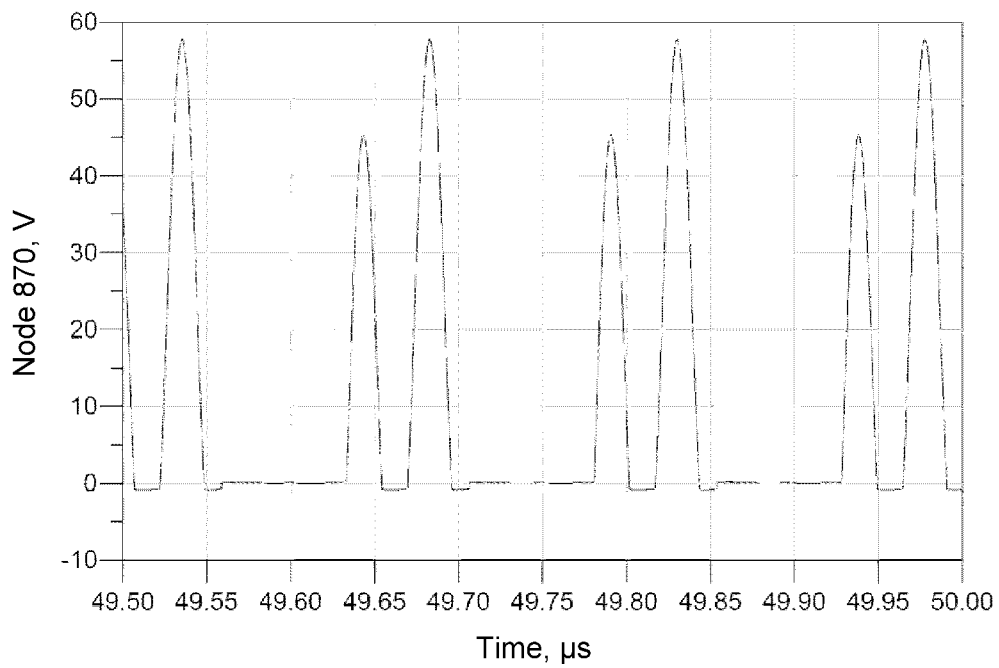
Figure 11F:
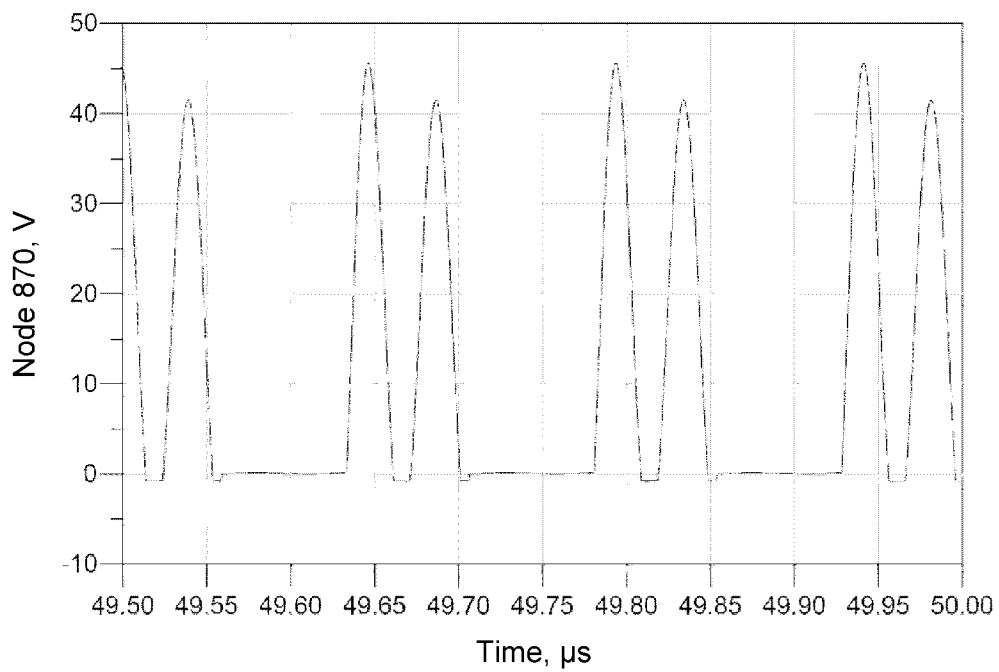

FIG. 10 is an embodiment of a graph 1000 illustrating power output of the driver circuit of FIGS. 8A-B as a function of leakage inductance. Graph 1000 illustrates the output power of the driver circuit 724 as the leakage inductance is increased for choke inductors 810 and/or 810*b* of various sizes. For example, graph 1000 illustrates the output power of the driver circuit 724 as the leakage inductance is increased for a choke inductor 810*a* and/or 810*b* of 20 μH, 50 μH, 500 μH, 1000 μH, and 10,000 μH. In an embodiment, as illustrated, the power output of the driver circuit 724 is independent of the size of the choke inductors 810a and/or 810b. When the leakage inductance is low (e.g., less than 0.3 µH), the power output oscillates. As the leakage inductance increases (e.g., past 0.3 µH), the power output begins to stabilize.

FIGS. 11A-F are embodiments of graphs 1100a-f illustrating voltage at a drain of a transistor of the driver circuit of FIGS. 8A-B as a function of time. Graphs 1100a-f illustrate the voltage waveform at output node 870 and/or output node 880 as a function of time. As an example, in each of graphs 1100a-f, the choke inductance is 1000 µH and the switching frequency is 6.78 MHz. In an embodiment, graph 1100a illustrates the voltage waveform when a leakage inductance is 0.001 µH, graph 1100b illustrates the voltage waveform when a leakage inductance is 0.01 µH, graph 1100c illustrates the voltage waveform when a leakage inductance is 0.05 µH, graph 1100d illustrates the voltage waveform when a leakage inductance is 0.08 µH, graph 1100e illustrates the voltage waveform when a leakage inductance is 0.2 µH, and graph 1100f illustrates the voltage waveform when a leakage inductance is 1.0 µH.

In an embodiment, when the leakage inductance is low (e.g., less than 0.3 µH), the voltage waveform at output node 870 and/or 880 may exhibit the characteristics of a class D driver (e.g., the voltage waveform at output nodes 870 and/or 880 exhibits a square-like shape). In some aspects, by exhibiting the characteristics of a class D driver, the driver circuit 724 may incur additional loss across the switching transistors 806 and/or 808. For example, additional losses may occur across the switching transistors 806 and/or 808 because of the increased difficulty in achieving zero voltage switching due to the ringing in the voltage waveform (e.g., the ringing in the voltage waveform may make it difficult to achieve zero voltage switching because of load variations). In this way, when the leakage inductance is high (e.g., greater than or equal to 0.3 µH), the performance of the driver circuit 724 may improve and stabilize.

Figure 12:
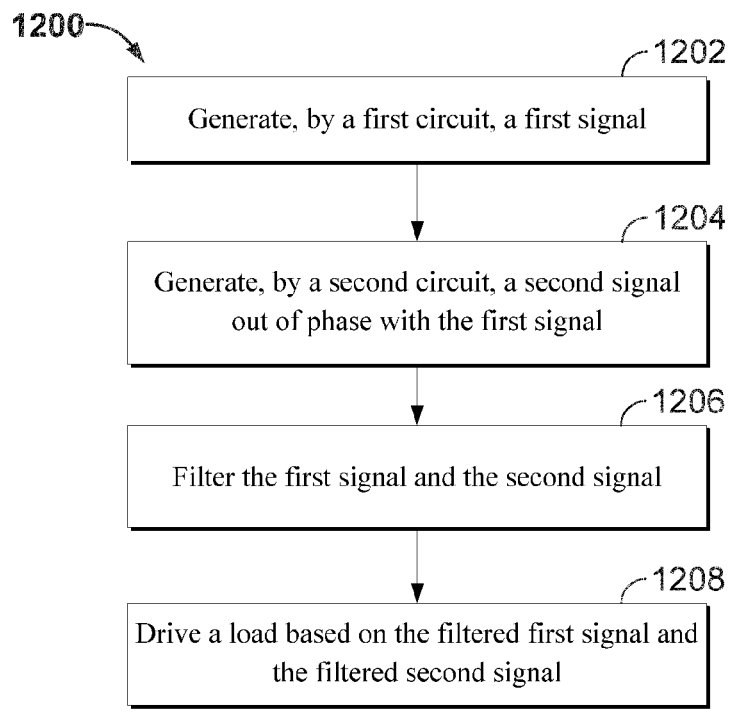
FIG. 12 is a flowchart of an exemplary method for transferring power wirelessly.

FIG. 12 is a flowchart of an exemplary method 1200 for transferring power wirelessly. Although the method of flowchart 1200 is described herein with reference to the transmitter 700 discussed above with respect to FIGS. 7-10 and 11A-F, a person having ordinary skill in the art will appreciate that the method of flowchart 1200 may be implemented by the transmitter 104 discussed above with respect to FIG. 1, the transmitter 204 discussed above with respect to FIG. 2, and/or any other suitable device (e.g., not necessarily a device that operates in a wireless power system). In an embodiment, the steps in flowchart 1200 may be performed by a driver in conjunction with one or more of the driver circuit 724, the first driver stage 702, and the second driver stage 704. Although the method of flowchart 1200 is described herein with reference to a particular order, in various embodiments, blocks herein may be performed in a different order, or omitted, and additional blocks may be added. A person having ordinary skill in the art will appreciate that the method of flowchart 1200 may be implemented in any communication device that may be configured to transmit power to a wireless power receiver and communicate with the wireless power receiver.

At block 1202, the method 1200 generates, by a first circuit, a first signal. In an embodiment, the first circuit includes a first inductor. At block 1204, the method 1200 generates, by a second circuit, a second signal out of phase with the first signal. In an embodiment, the second circuit includes a second inductor inductively coupled with the first inductor. The first inductor and the second inductor may share a node. The first inductor and the second inductor may have a leakage inductance of at least a minimum value so as to not produce a substantially square waveform at an output of the first circuit and at an output of the second circuit.

At block 1206, the method 1200 filters the first signal and the second signal. At block 1208, the method 1200 drives a load based on the filtered first signal and the filtered second signal.

Figure 13:
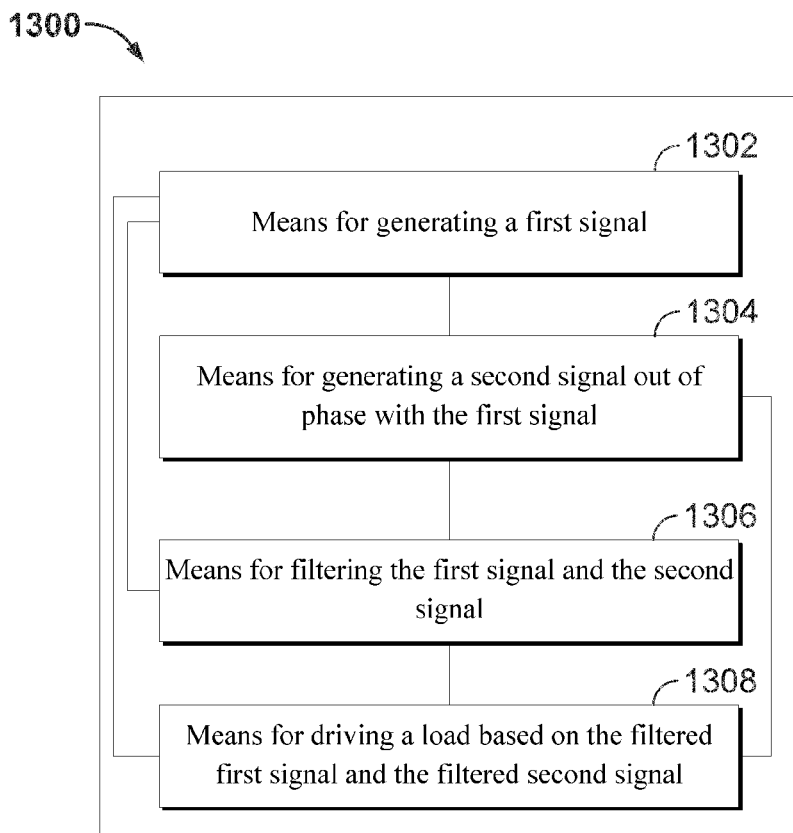
FIG. 13 is a functional block diagram of a driver, in accordance with an exemplary embodiment.

FIG. 13 is a functional block diagram of a wireless power transmitter 1300, in accordance with an exemplary embodiment. Wireless power transmitter 1300 comprises means 1302, means 1304, means 1306, and means 1308 for the various actions discussed with respect to FIGS. 1-10 and 11A-F. The transmitter 1300 includes means 1302 for generating a first signal. In an embodiment, means 1302 for generating a first signal may be configured to perform one or more of the functions discussed above with respect to block 1202. The transmitter 1300 further includes means 1304 for generating a second signal out of phase with the first signal. In an embodiment, means 1304 for generating a second signal out of phase with the first signal may be configured to perform one or more of the functions discussed above with respect to block 1204. The transmitter 1300 further includes means 1306 for filtering the first signal and the second signal. In an embodiment, means 1306 for filtering the first signal and the second signal may be configured to perform one or more functions discussed above with respect to block 1206. The transmitter 1300 further includes means 1308 for driving a load based on the filtered first signal and the filtered second signal. In an embodiment, means 1308 for driving a load based on the filtered first signal and the filtered second signal may be configured to perform one or more of the functions discussed above with respect to block 1208.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations. Means for generating a first signal may be provided by a driver. Means for generating a second signal may be provided by a driver. Means for filtering a first signal and a second signal may be provided by a filter. Means for driving a load based on the filtered first signal and the filtered second signal may be provided by a driver.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments of the invention.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A transmitter for transferring power wirelessly, comprising:
    a first circuit configured to generate a first signal, the first circuit comprising a first inductor;
    a second circuit configured to generate a second signal out of phase with the first signal, the second circuit comprising a second inductor inductively coupled with the first inductor, the first inductor and the second inductor sharing a node, the first inductor and the second inductor having a leakage inductance of at least a minimum value that is sufficient to produce a signal different from a substantially square waveform at an output of the first circuit and at an output of the second circuit; and
    a filter circuit configured to filter the first signal and the second signal, an output of the filter circuit configured to drive a load.

2. The transmitter of claim 1, wherein the first circuit and the second circuit comprise a push-pull switch mode driver.

3. The transmitter of claim 1, wherein the first circuit and the second circuit comprise a power supply.

4. The transmitter of claim 1, wherein the first circuit comprises a first switch and the second circuit comprises a second switch, and wherein the first inductor is a first choke inductor coupled to a drain of the first switch and the second inductor is a second choke inductor coupled to a drain of the second switch.

5. The transmitter of claim 1, wherein the filter circuit comprises a first filter circuit and a second filter circuit, wherein the first filter circuit comprises a first capacitor, a second capacitor, and a third inductor, and wherein the second filter circuit comprises a third capacitor, a fourth capacitor, and a fourth inductor.

6. The transmitter of claim 5, wherein the first capacitor is coupled to ground, the third inductor, and an output of the first circuit, wherein the second capacitor is coupled to ground, the third inductor, and the load, and wherein the third inductor is coupled to the first capacitor and the second capacitor.

7. The transmitter of claim 5, wherein the third capacitor is coupled to ground, the fourth inductor, and an output of the second circuit, wherein the fourth capacitor is coupled to ground, the fourth inductor, and the load, and wherein the fourth inductor is coupled to the third capacitor and the fourth capacitor.

8. The transmitter of claim 1, wherein the load comprises a transmit coil configured to transmit power wirelessly to charge a device.

9. The transmitter of claim 1, wherein the minimum value is 0.3 µH.

10. A method for transferring power wirelessly, comprising:
    generating, by a first circuit, a first signal, the first circuit comprising a first inductor;
    generating, by a second circuit, a second signal out of phase with the first signal, the second circuit comprising a second inductor inductively coupled with the first inductor, the first inductor and the second inductor sharing a node, the first inductor and the second inductor having a leakage inductance of at least a minimum value that is sufficient to produce a signal different from a substantially square waveform at an output of the first circuit and at an output of the second circuit;
    filtering the first signal and the second signal; and
    driving a load based on the filtered first signal and the filtered second signal.

11. The method of claim 10, wherein generating a first signal and generating a second signal comprise generating, by a push-pull switch mode driver, the first signal and the second signal.

12. The method of claim 10, wherein generating a first signal and generating a second signal comprise generating, by a power supply, the first signal and the second signal.

13. The method of claim 10, wherein the first circuit comprises a first switch and the second circuit comprises a second switch, and wherein the first inductor is a first choke inductor coupled to a drain of the first switch and the second inductor is a second choke inductor coupled to a drain of the second switch.

14. The method of claim 10, wherein filtering the first signal and the second signal comprises:
 filtering the first signal by a first filter circuit, wherein the first filter circuit comprises a first capacitor, a second capacitor, and a third inductor; and
 filtering the second signal by a second filter circuit, wherein the second filter circuit comprises a third capacitor, a fourth capacitor, and a fourth inductor.

15. The method of claim 14, wherein the first capacitor is coupled to ground, the third inductor, and an output of the first circuit, wherein the second capacitor is coupled to ground, the third inductor, and the load, and wherein the third inductor is coupled to the first capacitor and the second capacitor.

16. The method of claim 14, wherein the third capacitor is coupled to ground, the fourth inductor, and an output of the second circuit, wherein the fourth capacitor is coupled to ground, the fourth inductor, and the load, and wherein the fourth inductor is coupled to the third capacitor and the fourth capacitor.

17. The method of claim 10, wherein driving a load comprises driving a transmit coil.

18. The method of claim 17, further comprising transmitting, by the transmit coil, power wirelessly to charge a device.

19. The method of claim 10, wherein the minimum value is 0.3 µH.

20. An apparatus for transferring power wirelessly, comprising:
 means for generating a first signal, the means for generating the first signal comprising a first means for storing energy in a magnetic field;
 means for generating a second signal out of phase with the first signal, the means for generating the second signal comprising a second means for storing energy in a magnetic field inductively coupled with the first means for storing energy in a magnetic field, the first means for storing energy in a magnetic field and the second means for storing energy in a magnetic field sharing a node, the first means for storing energy in a magnetic field and the second means for storing energy in a magnetic field having a leakage inductance of at least a minimum value that is sufficient to produce a signal different from a substantially square waveform at an output of the means for generating the first signal and at an output of the means for generating the second signal;
 means for filtering the first signal and the second signal; and
 means for driving a load based on the filtered first signal and the filtered second signal.

21. The apparatus of claim 20, wherein the means for generating a first signal and the means for generating a second signal comprise a push-pull switch mode driver.

22. The apparatus of claim 20, wherein the means for generating a first signal and the means for generating a second signal comprise a power supply.

23. The apparatus of claim 20, wherein the means for generating the first signal comprises a first switch and the means for generating the second signal comprises a second switch, and wherein the first means for storing energy in a magnetic field is a first choke inductor coupled to a drain of the first switch and the second means for storing energy in a magnetic field is a second choke inductor coupled to a drain of the second switch.

24. The apparatus of claim 20, wherein the means for filtering the first signal and the second signal comprises:
 means for filtering the first signal, wherein the means for filtering the first signal comprises a first capacitor, a second capacitor, and a third inductor; and
 means for filtering the second signal, wherein the means for filtering the second signal comprises a third capacitor, a fourth capacitor, and a fourth inductor.

25. The apparatus of claim 24, wherein the first capacitor is coupled to ground, the third inductor, and an output of the first circuit, wherein the second capacitor is coupled to ground, the third inductor, and the load, and wherein the third inductor is coupled to the first capacitor and the second capacitor.

26. The apparatus of claim 24, wherein the third capacitor is coupled to ground, the fourth inductor, and an output of the second circuit, wherein the fourth capacitor is coupled to ground, the fourth inductor, and the load, and wherein the fourth inductor is coupled to the third capacitor and the fourth capacitor.

27. The apparatus of claim 20, wherein the means for driving a load comprises means for driving a transmit coil.

28. The apparatus of claim 27, further comprising means for transmitting power wirelessly to charge a device.

29. The apparatus of claim 20, wherein the minimum value is 0.3 µH.

30. A non-transitory computer-readable medium comprising code that, when executed, causes an apparatus to:
 generate, by a first circuit, a first signal, the first circuit comprising a first inductor;
 generate, by a second circuit, a second signal out of phase with the first signal, the second circuit comprising a second inductor inductively coupled with the first inductor, the first inductor and the second inductor sharing a node, the first inductor and the second inductor having a leakage inductance of at least a minimum value that is sufficient to produce a signal different from a substantially square waveform at an output of the first circuit and at an output of the second circuit;
 filter the first signal and the second signal; and
 drive a load based on the filtered first signal and the filtered second signal.

31. The medium of claim 30, further comprising code that, when executed, causes the apparatus to generate, by one of a push-pull switch mode driver or a power supply, the first signal and the second signal.

32. The medium of claim 30, further comprising code that, when executed, causes the apparatus to:
 filter the first signal by a first filter circuit, wherein the first filter circuit comprises a first capacitor, a second capacitor, and a third inductor; and
 filter the second signal by a second filter circuit, wherein the second filter circuit comprises a third capacitor, a fourth capacitor, and a fourth inductor.

33. The medium of claim 32, wherein the first capacitor is coupled to ground, the third inductor, and an output of the first circuit, wherein the second capacitor is coupled to ground, the third inductor, and the load, and wherein the third inductor is coupled to the first capacitor and the second capacitor.

34. The medium of claim 32, wherein the third capacitor is coupled to ground, the fourth inductor, and an output of the second circuit, wherein the fourth capacitor is coupled to ground, the fourth inductor, and the load, and wherein the fourth inductor is coupled to the third capacitor and the fourth capacitor.

35. The medium of claim 30, further comprising code that, when executed, causes the apparatus to transmit, by a transmit coil, power wirelessly to charge a device.

36. The medium of claim 30, wherein the minimum value is 0.3 μH.

* * * * *